US012656438B2

(12) United States Patent
Miura

(10) Patent No.: US 12,656,438 B2
(45) Date of Patent: Jun. 16, 2026

(54) IMAGE PROCESSING APPARATUS AND IMAGE PROCESSING METHOD

(71) Applicant: CANON MEDICAL SYSTEMS CORPORATION, Otawara (JP)

(72) Inventor: Motohiro Miura, Yaita (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 18/589,528

(22) Filed: Feb. 28, 2024

(65) Prior Publication Data

US 2024/0302469 A1 Sep. 12, 2024

(30) Foreign Application Priority Data

Mar. 7, 2023 (JP) ................................. 2023-035076

(51) Int. Cl.
*G01R 33/56* (2006.01)

(52) U.S. Cl.
CPC ............................... *G01R 33/5608* (2013.01)

(58) Field of Classification Search
CPC . G01R 33/5608; G01R 33/543; G01R 33/565
See application file for complete search history.

(56) References Cited

U.S. PATENT DOCUMENTS

| | | | |
|---|---|---|---|
| 2016/0069975 A1* | 3/2016 | Rothberg | G01R 33/5608 |
| | | | 324/322 |
| 2018/0279904 A1* | 10/2018 | Stainsby | G01R 33/5608 |
| 2020/0168324 A1* | 5/2020 | Parthan | G16H 40/20 |
| 2020/0249292 A1* | 8/2020 | Biber | G01R 33/36 |
| 2021/0333346 A1* | 10/2021 | Lee | G01R 33/5608 |

FOREIGN PATENT DOCUMENTS

JP        2015-136496 A        7/2015

* cited by examiner

*Primary Examiner* — G.M. A Hyder
(74) *Attorney, Agent, or Firm* — Oblon, McClelland, Maier & Neustadt, L.L.P.

(57) ABSTRACT

In one embodiment, an image processing apparatus comprising: a processing circuitry configured to: acquire an MR signal emitted from an object by an RF pulse of a first MRI apparatus being applied to the object; and generate an image based on the acquired MR signal, an MR signal corresponding to a period when a second MRI apparatus outputs an RF pulse, being not used for generating the image.

7 Claims, 14 Drawing Sheets

FIG. 9

IMAGE PROCESSING APPARATUS AND IMAGE PROCESSING METHOD

CROSS-REFERENCE TO RELATED APPLICATION

This application is based upon and claims the benefit of priority from Japanese Patent Application No. 2023-035076, filed on Mar. 7, 2023, the entire contents of which are incorporated herein by reference.

FIELD

Disclosed Embodiments relate to an image processing apparatus and an image processing method.

BACKGROUND

A magnetic resonance imaging (MRI) apparatus is an imaging apparatus that magnetically excites nuclear spin of an object placed in a static magnetic field by application of a radio frequency (RF) signal having the Larmor frequency and reconstructs an image based on magnetic resonance (MR) signals emitted from the object due to the excitation.

In general, an MRI apparatus is installed in a state of being provided with a radio wave shield and a magnetic field shield. The radio wave shield can prevent intrusion of an external electromagnetic wave in a frequency band that causes image noise. The radio wave shield can also suppress influence of the radio wave from RF generators and other devices on the operation of peripheral devices. In addition, the magnetic field shield can prevent intrusion of magnetic fields from sources of magnetic field fluctuations that may be a factor of reducing magnetic field uniformity, as exemplified by an electrical room and a large moving magnetic body such as an elevator. The magnetic field shield can also suppress influence of leakage magnetic fields on the operation of the peripheral devices.

However, depending on the installation facility such as a hospital, two or more MRI apparatuses are installed close to each other and the shielding effect against radio waves and/or magnetic fields is not sufficient, so the quality of reconstructed images based on MR signals is not satisfactorily maintained in some cases. For example, when two MRI apparatuses disposed close to each other are the same in static magnetic field strength, both are almost the same in magnetic resonance frequency, and thus, an artifact may occur if an excitation RF pulse of one of two MRI apparatuses is mixed into the data of the other MRI apparatus during its data acquisition of MR signals. If an external electromagnetic wave as a jamming signal is received in addition to MR signals emitted by a human body during data acquisition of the MR signals, noise is mixed into the reconstructed image and impairs image quality in some cases.

BRIEF DESCRIPTION OF THE DRAWINGS

FIG. 9 is a timing chart illustrating the influence of the external RF pulse on the data acquisition of MR signals according to the third modification of the first embodiment;

DETAILED DESCRIPTION

Hereinbelow, respective embodiments of an image processing apparatus and an image processing method related to MRI apparatuses will be described in detail by referring to the accompanying drawings.

In one embodiment, an image processing apparatus comprising: a processing circuitry configured to: acquire an MR signal emitted from an object by an RF pulse of a first MRI apparatus being applied to the object; and generate an image based on the acquired MR signal, an MR signal corresponding to a period when a second MRI apparatus outputs an RF pulse, being not used for generating the image.

(Overall Configuration of MRI Apparatus)

Figure 1:
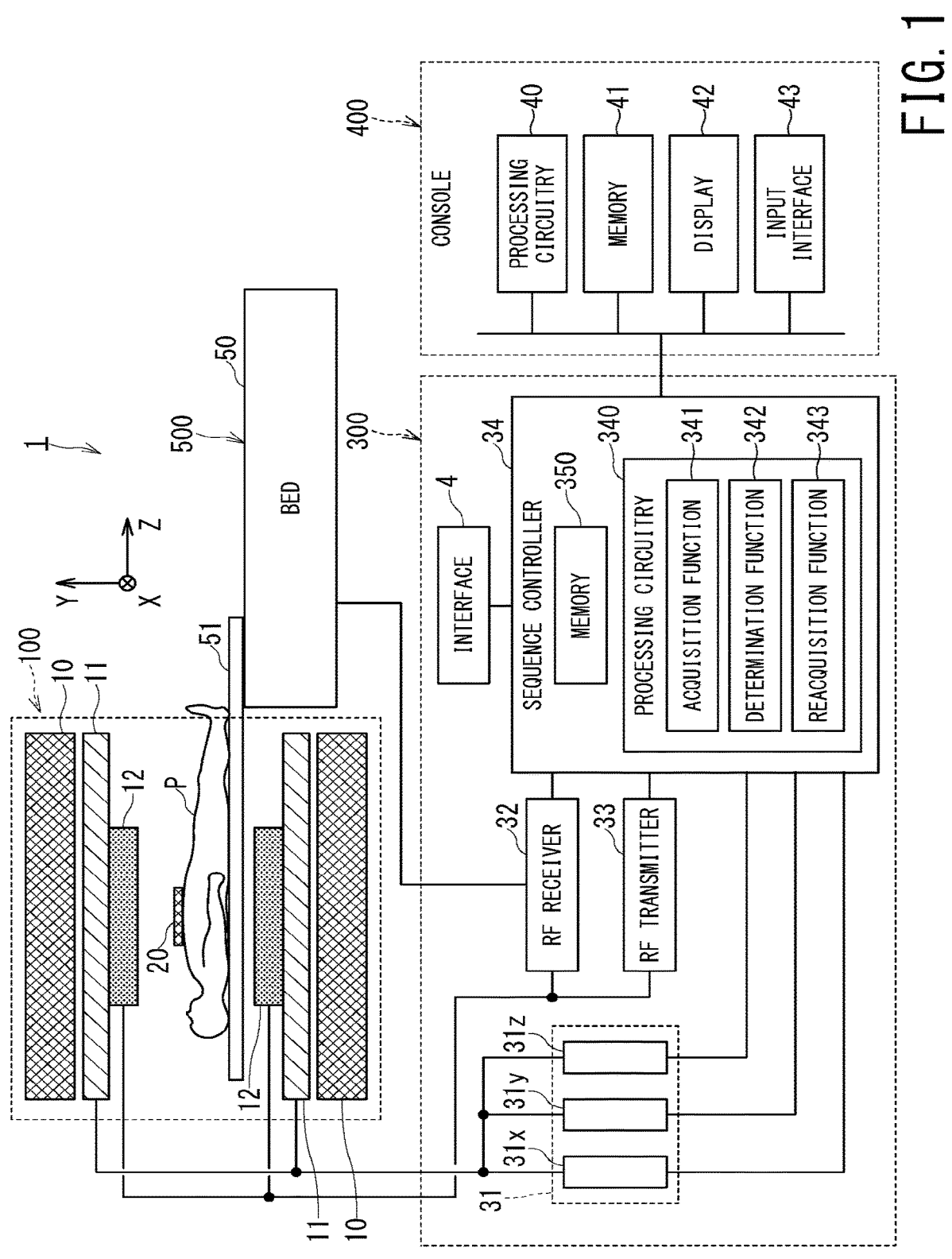
FIG. 1 is a block diagram illustrating an overall configuration of an MRI apparatus according to the first embodiment.

FIG. 1 is a block diagram illustrating an overall configuration of an MRI apparatus 1 according to one embodiment. The MRI apparatus 1 includes a gantry 100, a control cabinet 300, an image processing apparatus (for example, a console) 400, and a bed 500.

Although FIG. 1 illustrates a cylindrical MRI apparatus in which each of a static magnetic field magnet 10, a gradient coil assembly 11, and a WB (Whole Body) coil 12 has a roughly cylindrical shape, the MRI apparatus 1 according to the embodiment may be configured as an open-type MRI apparatus. The open-type MRI apparatus is provided with a gantry formed into a pair of flat circular shapes and is configured to image an object P in an open space sandwiched between two flat static magnetic field magnets arranged in parallel, for example. The open-type MRI apparatus has the same configuration as the cylindrical MRI apparatus except that each of the static field magnets, the gradient coil assembly, and the WB coil constituting the gantry are formed into a pair of flat shapes in parallel with each other.

The gantry 100 includes, for example, the static magnetic field magnet 10, the gradient coil assembly 11, and the WB coil 12, and these components are housed in a cylindrical housing. The bed 500 includes a bed body 50 and a table 51. The MRI apparatus 1 also includes at least one RF coil 20 to be disposed close to an object P. Although the RF coil 20 is treated as one of the components of the MRI apparatus 1 in the following description, there may be cases where the RF coil 20 is not included in the configuration of the MRI apparatus 1 but is configured to be connectable to the MRI apparatus 1. More specifically, the RF coil 20 and the table 51 of the MRI apparatus 1 are configured to be connectable to each other.

The control cabinet 300 includes three gradient coil power supplies 31 (31x for the X-axis, 31y for the Y-axis, and 31z for the Z-axis), an RF receiver 32, an RF transmitter 33, and a sequence controller 34.

The static magnetic field magnet 10 of the gantry 100 is substantially in the form of a cylinder and generates a static magnetic field inside a bore, which is a space inside the cylindrical structure of the static magnetic field magnet and is also an imaging region of the object P. The static magnetic field magnet 10 includes a superconducting coil inside, and the superconducting coil is cooled down to an extremely low temperature by liquid helium. The static magnetic field magnet 10 generates a static magnetic field by applying an electric current provided from a static magnetic field power supply (not shown) to the superconducting coil in an excitation mode. The static magnetic field magnet 10 shifts to a persistent current mode, and the static magnetic field power supply is disconnected. Once it shifts to the persistent current mode, the static magnetic field magnet 10 continues to generate a strong static magnetic field for a long time, for example, over one year. Note that the static magnetic field magnet 10 may be configured as a permanent magnet. Additionally or alternatively, static magnetic field magnets 10 may be configured as a pair of flat magnets in parallel with each other.

The gradient coil assembly 11 is also substantially in the form of a cylinder and is fixed to the inside of the static magnetic field magnet 10. This gradient coil assembly 11 is composed of three gradient coils for the respective X-axis, Y-axis, and Z-axis. The three gradient coils generate gradient magnetic fields in the respective directions of the X-axis, Y-axis, and Z-axis by being supplied with gradient magnetic field currents from the respective gradient coil power supplies 31x, 31y, and 31z and then apply the generated gradient magnetic fields to the object P. When the static magnetic field magnet 10 is configured as a pair of flat magnets in parallel with each other, the gradient coil assembly 11 also has a similar shape.

The bed body 50 of the bed 500 can move the table 51 in the vertical direction and in the horizontal direction and move the table 51 with the object P placed thereon to a predetermined height before imaging. Afterward, the bed body 50 moves the table 51 in the horizontal direction so as to move the object P to the inside of the bore.

The WB coil 12 is shaped substantially in the form of a cylinder so as to surround the object P and is fixed to the inside of the gradient coil assembly 11. The WB coil 12 applies RF pulses transmitted from the RF transmitter 33 to the object P, and can receive MR signals emitted from the object P by excitation of hydrogen nuclei. When the static magnetic field magnet 10 is configured as a pair of flat magnets in parallel with each other, the WB coil 12 also has a similar shape.

The RF coil 20 receives MR signals emitted from the object P at a position close to the object P. There are various models of the RF coil 20 depending on an anatomical imaging part of the object P, such as the head, the chest, the spine, the lower limbs, and the whole body. FIG. 1 illustrates a state in which the RF coil 20 for the chest is attached to the object P. Each of the WB coil 12 and the RF coil 20 is an aspect of receiver coils for receiving MR signals.

The RF transmitter 33 transmits each RF pulse to the WB coil 12 based on an instruction from the sequence controller 34. The RF receiver 32 receives MR signals detected by the WB coil 12 and/or the RF coil 20, and transmits raw data obtained by digitizing the detected MR signals to the sequence controller 34.

The sequence controller 34 performs a scan of the object P by driving the gradient coil power supplies 31, the RF transmitter 33, and the RF receiver 32 under the control of the console 400. When the sequence controller 34 receives the raw data from the RF receiver 32 in the scan, the sequence controller 34 transmits the raw data to the console 400.

In order to acquire data of MR signals while maintaining satisfactory image quality, during data acquisition of the MR signals, the sequence controller 34 can perform processing of excluding data that may be a factor of deteriorating image quality of MR images. Note that part or all of this processing may be performed by the console 400. The sequence controller 34 includes processing circuitry 340 and a memory 350.

The processing circuitry 340 is a circuit provided with a central processing unit (CPU) and/or a special-purpose or general-purpose processor, for example. The processor implements various functions described below by executing various programs stored in the memory 350. The processing circuitry 340 may be configured of hardware such as an FPGA (Field Programmable Gate Array) and an ASIC (Application Specific Integrated Circuit). The various functions described below can also be implemented by such hardware. Additionally, the processing circuitry 340 can implement the various functions by combining hardware processing and software processing based on its processor and programs.

The memory 350 is a recording medium including a ROM (Read-Only Memory) and/or a RAM (Random Access Memory) in addition to an external memory device such as a HDD (Hard Disk Drive) and an optical disc device. The memory 350 stores various programs to be executed by the processor of the processing circuitry 340 as well as various data and information.

Furthermore, the memory 350 can store information for reacquiring data of MR signals, such as the information on the phase encode of the invalidated MR signal based on the determination and information on a predetermined threshold for determining the invalid MR signal. In addition, the memory 350 can store threshold information for invalidating data of MR signals based on signal intensity of the MR signals.

The console 400 is configured as a computer that includes processing circuitry 40, a memory 41, a display 42, and an input interface 43. The console 400 is one aspect of the image processing apparatus.

The configuration of the processing circuitry 40 is the same as the processing circuitry 340 of the sequence controller 34 and is configured of a circuit including a CPU (Central Processing Unit) and/or a dedicated processor or a general-purpose processor. The configuration of the memory 350 is the same as the memory 41 of the sequence controller

34, and is configured of a recording medium. Duplicate descriptions regarding the processing circuitry 40 and the memory 350 are omitted.

The display 42 is a display device such as a liquid crystal display panel, a plasma display panel, and an organic EL panel.

The input interface 43 includes various devices for a user to input various data and information, and is configured of a mouse, a keyboard, a trackball, and/or a touch panel, for example.

The console 400 controls the entirety of the MRI apparatus 1 by using each of these components. Specifically, the console 400 receives instructions and various information items including imaging conditions through operation of the input interface 43 such as the mouse and the keyboard by the user such as a medical imaging technician. The processing circuitry 40 causes the sequence controller 34 to perform a scan based on the inputted the imaging conditions, and then reconstructs an image based on the raw data sent from the sequence controller 34. The reconstructed image is displayed on the display 42 and/or stored in the memory 41.

The MRI apparatus 1 further includes an interface 4. In order to acquire data of MR signals while maintaining satisfactory image quality, the interface 4 can receive information for excluding data that may be a factor in deteriorating image quality of MR images during data acquisition of the MR signals. The interface 4 can receive information on an RF pulse to be generated by another MRI apparatus, i.e., receive information from an external-RF-pulse detector 5 (FIG. 11) provided in another MRI apparatus. The interface 4 may be configured to be able to receive information from a jamming signal detector 6 (FIG. 12) provided in the examination room of the MRI apparatus 1. The interface 4 may receive information by wire or wirelessly.

(Influence of Other MRI Apparatus)

When two or more MRI apparatuses are installed close to each other in a facility such as a hospital, it is known that the quality of a reconstructed image (i.e., an MR image) based on MR signals is not satisfactorily maintained in some cases due to insufficient shielding effects against radio waves and/or magnetic fields.

Prior to description of the operation of the MRI apparatus 1 according to the embodiment shown in FIG. 2, a brief description will be given of general MR image acquisition, signal intensity, and the influence of installing two or more MRI apparatuses in close proximity.

The MRI apparatus 1 acquires MR signals emitted from an object in response to an RF pulse applied to the object. The MRI apparatus 1 adds position information on each MR signal by acquiring data of each MR signal while superimposing gradient magnetic fields on the static magnetic field. The respective gradient magnetic fields along the X-axis, Y-axis, and Z-axis are superimposed in such a manner that a slice selection gradient pulse Gs, a phase encoding gradient pulse Gp, and a readout (i.e., frequency encoding) gradient pulse Gr orthogonal to each other are formed in desired directions.

For example, the slice selection gradient pulse Gs selects any imaging cross-section (i.e., slice), the phase encoding gradient pulse Gp encodes the phase of each MR signal depending on the spatial position, and the readout gradient pulse Gr encodes the frequency of each MR signal. In addition, the slice selection gradient pulse Gs encodes the phase of each MR signal in the slice direction according to the spatial position during data acquisition for a three-dimensional MR image. In this manner, data of MR signals to which spatial position information is added are acquired.

MR images are reconstructed by performing 2D (two-dimensional) or 3D (three-dimensional) Fourier transform on 2D or 3D k-space data that are filled with data of the acquired MR signals.

Figure 2:
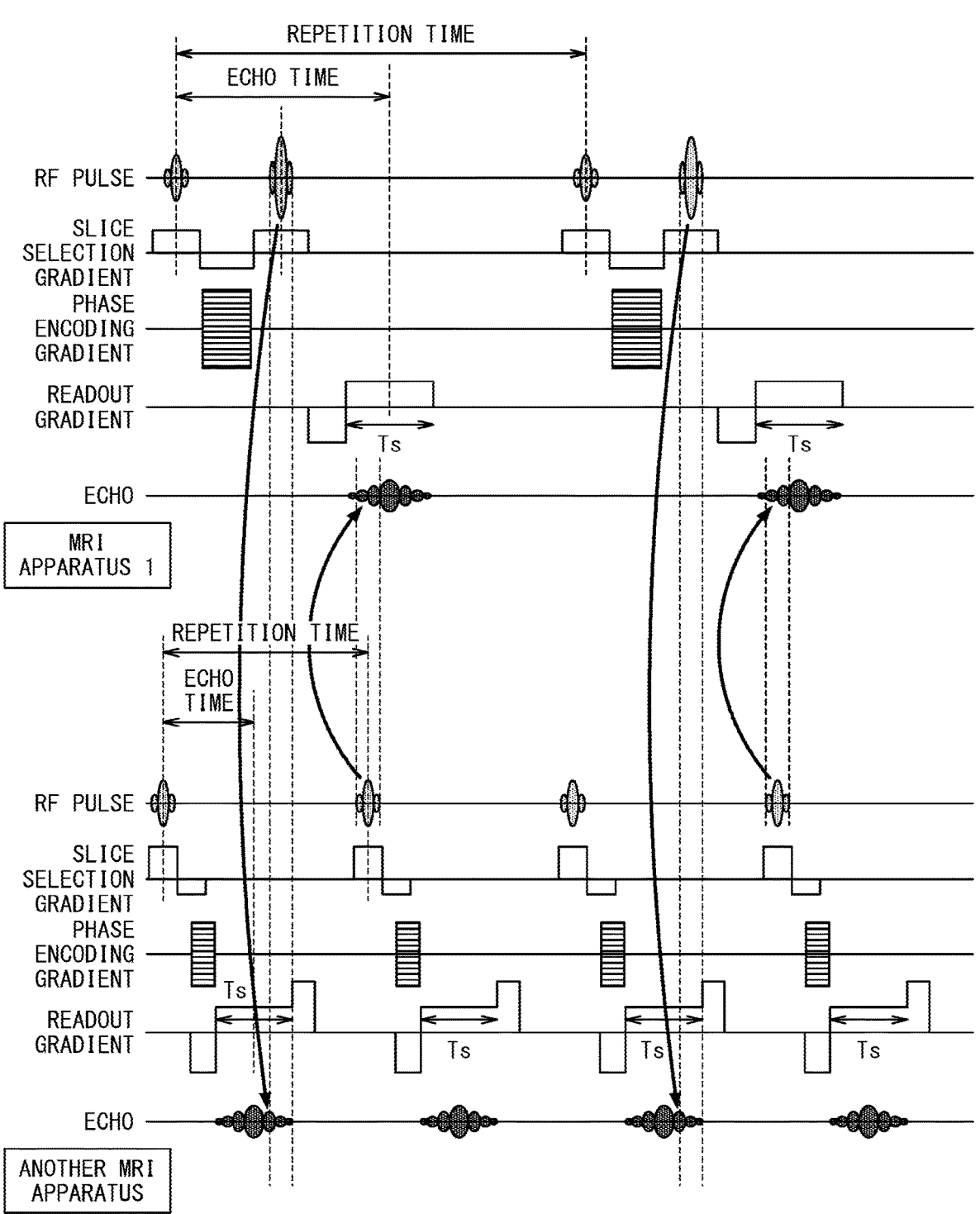
FIG. 2 is a timing chart illustrating influence when two or more MRI apparatuses are installed close to each other.

FIG. 2 shows a case where data acquisition using a 2D spin echo (SE) method by one MRI apparatus and data acquisition using a 2D gradient echo (GRE) method by another MRI apparatus are performed in parallel.

In the SE method, a 90° RF pulse and a 1800 RF pulse are repeatedly applied as a combination of a series of RF pulses at intervals of repetition time (TR). Since a series of a combination of RF pulses are repeatedly applied at intervals of TR, a steady state is established, and thus, an MR signals is observed at each echo time (TE). Transverse magnetization is refocused by applying the 1800 RF pulse after the elapse of TE/2 from the application timing of the 90° RF pulse, and the MR signal of spin echo is observed after the elapse of TE/2 from the application timing of the 1800 RF pulse. Each MR signal is acquired as data during the sampling time (Ts) of the readout gradient pulse Gr.

The spin-lattice relaxation time (T1) differs depending on the biological tissue and each disease. Similarly, the spin-spin relaxation time (T2) differs depending on the biological tissue and each disease. The signal intensity expression Sig_SE of the general SE method is the below Expression 1 when TE<<TR. In Expression 1, p is proton density.

$$\mathrm{Sig\_SE} = \rho * \left(1 - \exp(-TR/T1)\right) * \exp(-TE/T2) \qquad \text{(Expression 1)}$$

As shown in Expression 1, a T1 weighted image can be obtained by setting TR and TE to small values, such as TR=about 500 ms and TE=about 15 ms, for example. In addition, a T2 weighted image can be obtained by setting TR and TE to large values, such as TR=about 3000 ms and TE=about 120 ms, for example. In this manner, a desired contrast enhanced MR image can be obtained based on the combination of TR and TE.

In the GRE method (also called FE method), after exciting protons by applying an RF pulse with a flip angle of 8°, an encoding gradient pulse is applied, and then the polarity of the readout gradient pulse Gr is inversed, so that the MR signal is observed after the elapse of TE from the application timing of the 6° RF pulse. In the general GRE method, the signal intensity expression Sig GRE is the below Expression 2 when TR>>T2. In addition, in the GRE method, T2 is replaced by T2* due to the influence of magnetic field non-uniformity, for example.

$$\mathrm{Sig\_GRE} = \rho * \left(\sin\theta * \left(1 - \exp(-TR/T1)\right) * \exp(-TE/T2*)\right) / \left(1 - \exp(-TR/T1) * \cos\theta\right) \quad \text{(Expression 2)}$$

As shown in Expression 2, a desired contrast enhanced MR image can be obtained based on the combination of TR, TE, and the flip angle. In addition, the contrast is adjusted by forced phase dispersion using a spoiler RF pulse in some cases. Furthermore, the contrast is adjusted by known methods such as various pre-pulses and inversion time (TI) in the IR method in some cases.

In order to obtain a desired contrast enhanced MR image, RF pulses are repeatedly applied at intervals of TR, and each MR signal is observed in a steady state. In addition, the signal intensity of each MR signal to be acquired varies, as shown in Expression 1 and Expression 2, depending on the setting of imaging conditions including various parameters and the type of pulse sequence, for example. Although FIG. 2 shows the data acquisition of MR signals by the SE method and the GRE method, it may also be a high-speed imaging method such as a FSE (Fast Spin Echo) method and an EPI (Echo Planar Imaging) method as the type of pulse sequence.

Next, a description will be given of influence when two or more MRI apparatuses are installed in close proximity. For example, during data acquisition of MR signals in one MRI apparatus, application of an external RF pulse in another MRI apparatuses temporally overlaps in some cases depending on the setting of imaging conditions including the type of pulse sequence and various parameters. Similarly, application of an RF pulse in one MRI apparatus may temporally overlap during data acquisition of MR signals in another MRI apparatus.

In such a case, for example, due to insufficient shielding effects against radio waves and/or magnetic fields, the external RF pulse applied in one MRI apparatus may be mixed as a jamming signal during data acquisition in another MRI apparatus and may cause an artifact in the MR image. Furthermore, during data acquisition of MR signals of one MRI apparatus, an external electromagnetic wave originating from another MRI apparatus may be accidentally received as a jamming signal in the one MRI apparatus, which may impair the quality of the MR image. In particular, if two MRI apparatuses installed in close proximity are the same in static magnetic field strength, both are almost the same in magnetic resonance frequency (i.e., the Larmor frequency), and thus, both become susceptible to the above-described adverse effects.

Furthermore, in a facility such as a hospital, when two MRI apparatuses with the same static magnetic field strength are installed in close proximity, both MRI apparatuses are set and installed in such a manner that the Larmor frequency of one MRI apparatus is slightly shifted from that of the other MRI apparatus. Even if a plurality of MRI apparatuses are installed in such a manner that the Larmor frequencies of the respective MRI apparatuses are slightly different from each other, due to the RF pulse bandwidth and offset of the RF pulse frequency for multi-slice selection, the bandwidth of the Larmor frequency may overlap between the plurality of MRI apparatuses, which may adversely affect MR images, for example.

For this reason, in the case of being installed in close proximity to at least one other MRI apparatus, the MRI apparatus 1 according to the embodiment excludes data having a possibility of causing deterioration in image quality of the MR image during data acquisition of MR signals in order to satisfactorily maintain image quality. In this specification, an RF pulse to be outputted by "another MRI apparatus" is referred to as "the external RF pulse" and "an RF pulse" to be outputted by "the MRI apparatus 1" subjected to the adverse effects from "another MRI apparatus" is simply referred to as "the RF pulse" in order to distinguish one from another.

The configuration and operation of the other MRI apparatus is not substantially different from the MRI apparatus 1 according to at least one embodiment described below, and duplicate descriptions are omitted. Furthermore, during data acquisition of MR signals, each of the other MRI apparatus and the MRI apparatus 1 can exclude the data having a possibility of causing deterioration in image quality of MR images.

In order to exclude the data that may become a factor of deteriorating image quality of MR images during data acquisition of MR signals, information on the external RF pulse of the other MRI apparatus is received by the MRI apparatus 1 in the first embodiment and the second embodiment, and the MRI apparatus 1 in the third embodiment detects information on a jamming signal.

First Embodiment

Figure 3:
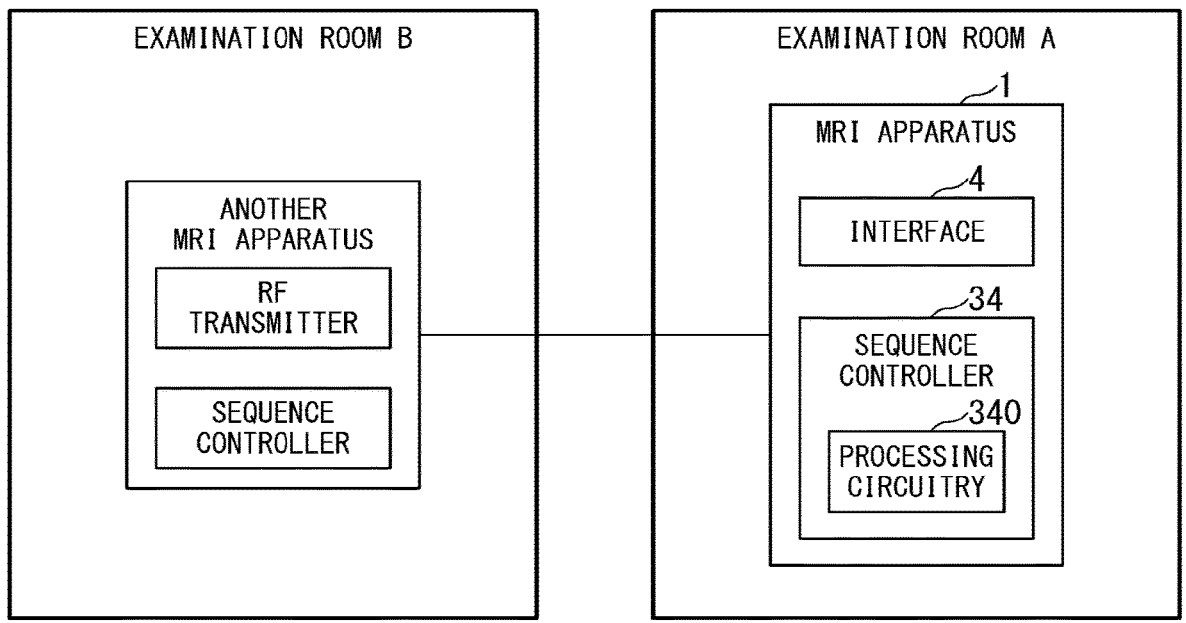
FIG. 3 is a schematic diagram illustrating relationship between the MRI apparatus according to the first embodiment and another MRI apparatus.

FIG. 3 is a schematic diagram illustrating relationship between the MRI apparatus 1 according to the first embodiment and another MRI apparatus. The interface 4 of the MRI apparatus 1 is configured to be able to communicate with another MRI apparatus so as to be able to receive at least a timing signal related to the application timing of the external RF pulse in the pulse sequence, i.e. information about the period when another MRI apparatus outputs the external RF pulse. The interface 4 can receive the timing signal related to the application timing of the external RF pulse applied in the other MRI apparatuses from a timing circuit such as an RF transmitter, a sequence controller, and processing circuitry of the other MRI apparatus, for example.

The processing circuitry 340 implements an acquisition function 341, a determination function 342, and a reacquisition function 343, as shown in FIG. 1. The acquisition function 341 acquires MR signals. The determination function 342 performs determination as to whether the external RF pulse from the other MRI apparatus has a possibility of affecting the MR signal during acquisition or not. In this determination, if it is determined that the external RF pulse has the possibility of affecting the MR signal, the reacquisition function 343 invalidates the MR signal during acquisition and reacquires an MR signal equivalent to the invalidated MR signal. That is, a specific MR signal acquired in a period when the other MRI apparatus outputs an external RF pulse is not used for generating the image. Furthermore, an MR signal corresponding to a phase encode in the period is acquired after the period. In this specification, the phase encoding so as to acquire an MR signal(s) of specific view(s) is/are referred to as "a phase encode", "phase encodes", and "the phase encode(s)".

Figure 4:
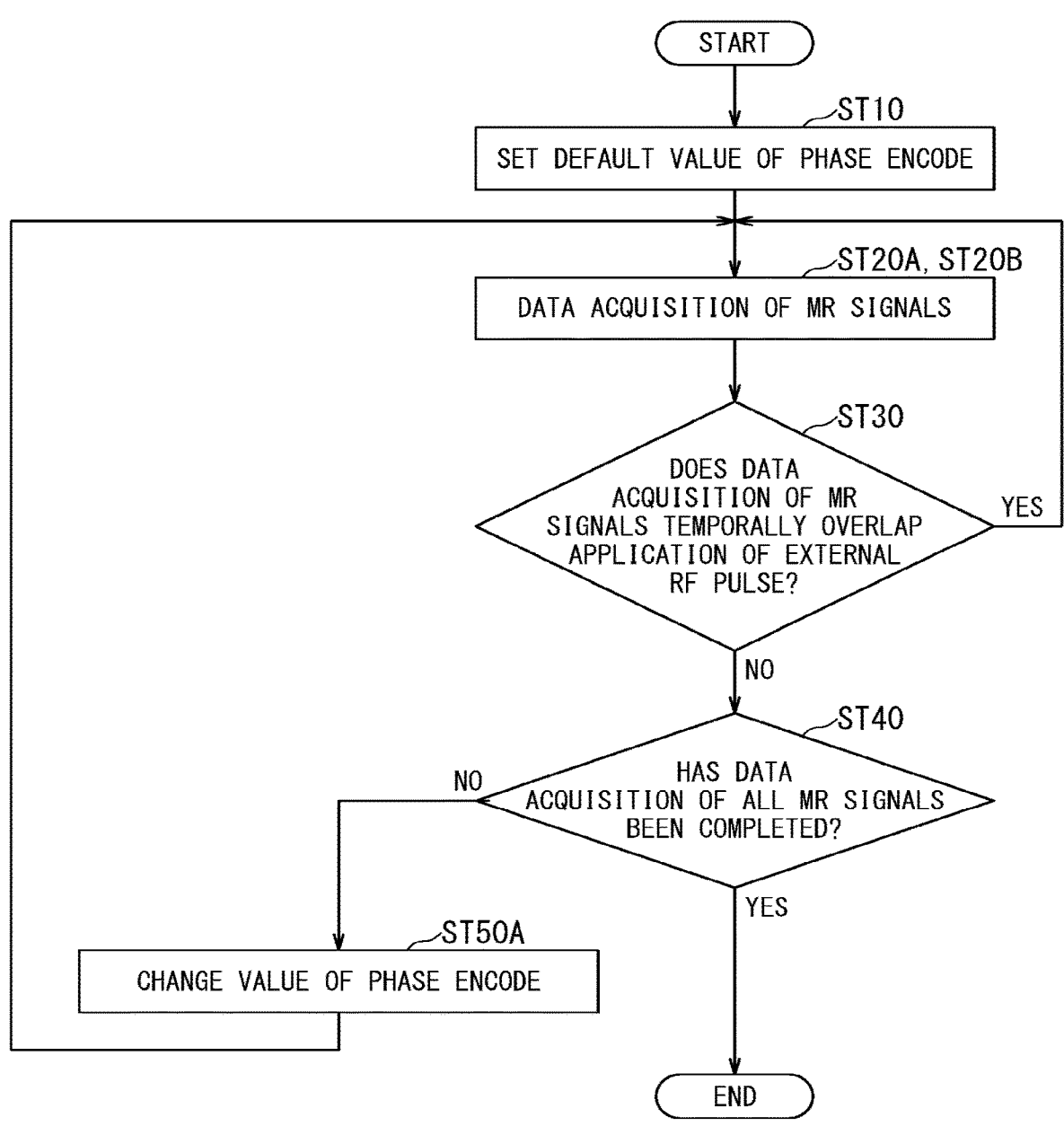
FIG. 4 is a flowchart illustrating operation of data acquisition of MR signals according to the first embodiment.
Figure 5:
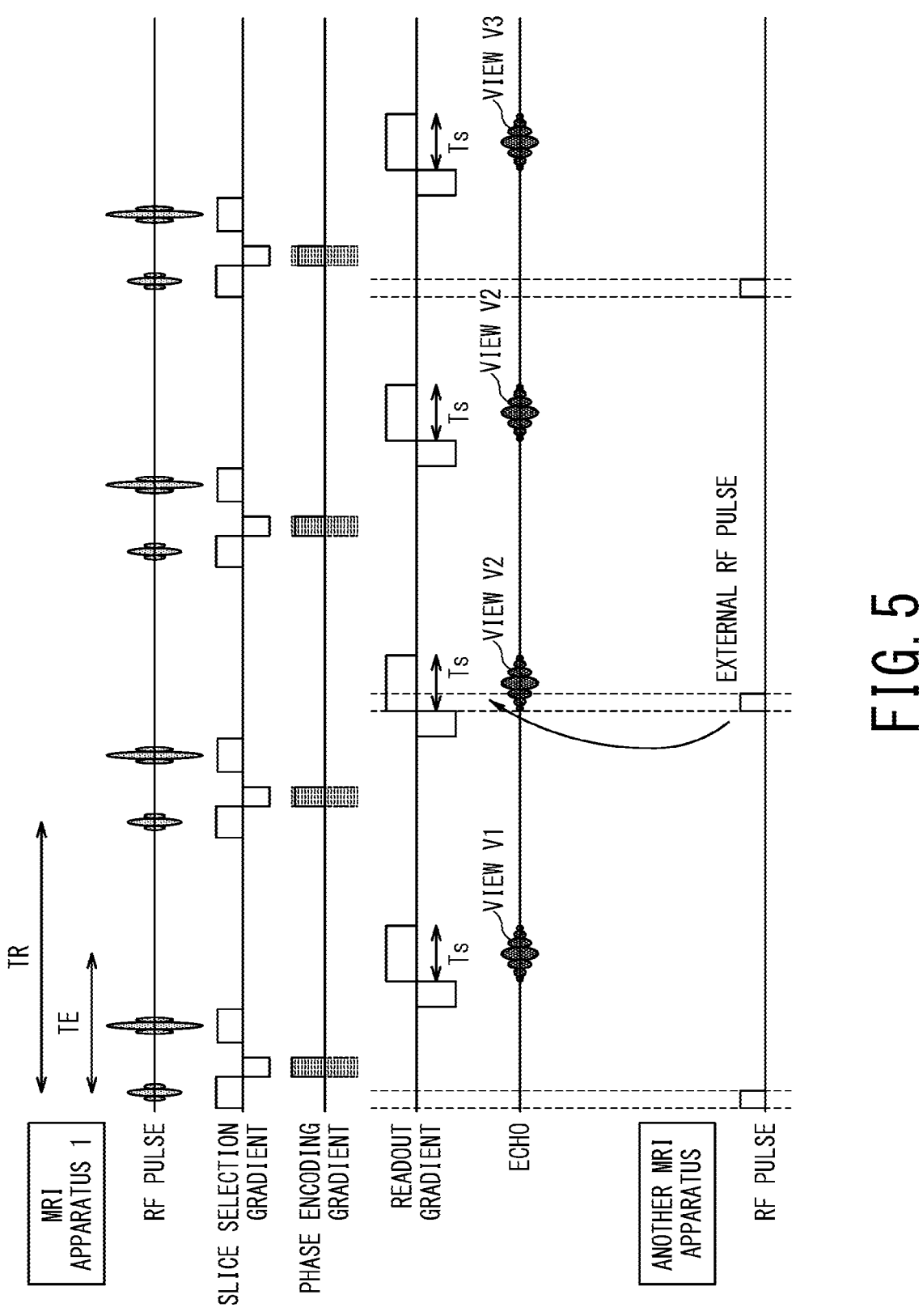
FIG. 5 is a timing chart illustrating influence of an external RF pulse on the data acquisition of MR signals according to the first embodiment.

The operation of each of the above-described functions of the processing circuitry 340 will be described based on the flowchart of FIG. 4 by referring to FIG. 5 and FIG. 6 as required. For distinction in the following description, the data acquisition step in FIG. 4 is denoted by the step ST20A when the data acquisition of MR signals is performed by the acquisition function 341, and denoted by the step ST20B when the data acquisition of MR signals is performed by the reacquisition function 343.

First, the object P is placed on the table 51. Further, the processing circuitry 340 set various conditions for performing a scan by the sequence controller 34 based on the imaging conditions including various parameters such as the number of phase encodings, TE, and TR obtained from input operation by a user, a preset examination type, and an examination name, for example. Note that the number of phase encodings is selected according to any image resolution, image S/N ratio, and imaging time, for example.

The phase encoding step is set on the basis of the number of phase encodings. For example, when the number of phase encodings is set to 256 in the imaging conditions, the center line in k-space without application of the phase encoding gradient pulse is treated as the zero phase encode, and a total of 256 phase encoding gradient pulses are composed of 128 pulses on the plus side, 127 pluses on the minus side, and the zero phase encode. In every phase encoding step, the MR signal is acquired as data. Additionally or alternatively, a half-Fourier method may be used.

In the step ST10, the acquisition function 341 sets the initial value of the phase encode. The setting of the initial value of the phase encode is performed based on the imaging conditions including various parameters, for example. The initial value of the phase encode may be set based on table data or information on the phase encode stored in the memory 350, for example.

In the step ST20A, the acquisition function 341 acquires data of MR signal in units of repetition time in the phase encode having been set. If the processing continues from the step ST10 to the step ST20A, the initial value of the phase encode is used. If the processing returns from the step ST50A to the step ST20A, the phase encode changed in the step ST50A is used. In addition, regardless of the determination result as to whether the external RF pulse has a possibility of affecting the MR signal during acquisition or not, the acquisition function 341 keeps both the repetition time and the application cycle of the RF pulse for generating the MR signals constant to acquire the MR signals.

If it is determined in advance that external RF pulse may affect the MR signal to be acquired, the acquisition function 341 may not acquire a specific MR signal in the period when the other MRI apparatus outputs the external RF pulse, while keeping both the repetition time TR and the application cycle of the RF pulse constant so as to maintain a steady state. Regardless of whether the specific MR signal is acquired or not, it is not used for generating the image.

In the step ST30, for each unit of the repetition time, the determination function 342 determines whether the external RF pulse has a possibility of affecting the MR signal during acquisition or not. The determination function 342 acquires information about the period when the other MRI apparatus outputs the external RF pulse. Then, whether the external RF pulse has the possibility of affecting the MR signal during acquisition is determined, for example, by whether the sampling time to be set as the acquisition period of MR signals temporally overlaps the application time of the external RF pulse in the other MRI apparatus or not.

The overlap between the sampling time of an MR signal and the application time of the external RF pulse is determined on basis of the timing signal indicative of the application timing of the external RF pulse, and this timing signal is received by the interface 4. As to the timing signal to be received by the interface 4, it is sufficient if it includes information on the application timing of the external RF pulse. Instead of the timing signal indicative of the application timing of the external RF pulse, for example, a timing signal indicating rising or falling point of the gradient pulse for selectively exciting a slice may be used.

In the step ST30, if it is determined that the external RF pulse has a possibility of affecting the MR signal during acquisition (YES in FIG. 4), the processing proceeds to the step ST20B in which an MR signal having the same phase encode as the phase encode of the invalidated MR signal is reacquired.

In the step ST20B, the reacquisition function 343 acquires data of MR signals in units of repetition time in the phase encoding having been set. The reacquisition function 343 reacquires an MR signal having the same phase encode as that of the invalidated MR signal immediately after the invalidation. Regardless of the result of the determination as to whether the external RF pulse has a possibility of affecting the MR signal during acquisition or not, the reacquisition function 343 keeps both the repetition time and the application cycle of the RF pulse for generating the MR signals constant to acquire the MR signals.

The method for acquiring MR signals in the MRI apparatus 1 in the case where the MR signals are influenced by the external RF pulse during data acquisition will be described in detail by reference to FIG. 5 and FIG. 6. The hatched region in FIG. 6 indicates data of the reacquired MR signal after the invalidation. A view is defined as a specific readout line in k-space to be acquired with a specific phase encode. For example, the MRI apparatus 1 changes the phase encode up to the view VN (N: natural number) in the steady state so as to acquire data of MR signals from the view V1, the view V2, the view V3, the view V4 . . . and to the view VN using the two-dimensional SE method. As shown in FIG. 5, for example, if the timing signal indicating the application timing of the external RF pulse is received during data acquisition of the MR signal from the view V2, the data of the MR signal from the view V2 is invalidated. Thereafter, the MR signal having the same phase encode as that (i.e., the view V2) of the invalidated MR signal is acquired again immediately after the invalidation.

Returning to FIG. 4, in the step ST30, if it is determined that the external RF pulse does not affect the MR signal during acquisition (i.e., NO in FIG. 4), the processing proceeds to the step ST40 in which it is determined whether the sequence is completed or not.

In the step ST40, the acquisition function 341 and the reacquisition function 343 determine whether the data acquisition of all the MR signals has been completed or not.

In the step ST40, if it is determined that the data acquisition of all the MR signals has not yet been completed (i.e., NO in FIG. 4), the processing proceeds to the step ST50A in which the phase encode is changed. In the step ST40, if it is determined that the data acquisition of all the MR signals has been completed (i.e., YES in FIG. 4), the routine in FIG. 4 is completed. After the data acquisition of all the MR signals is completed, the MR image is reconstructed.

In the step ST50A, the acquisition function 341 changes the phase encode. After changing the phase encode, the processing proceeds to the step ST20A in which the MR signals are sequentially acquired in units of repetition time. The phase encode is changed based on table data and information on the phase encoding stored in the memory 350, for example.

According to the MRI apparatus 1 of the first embodiment, when another MRI apparatus is installed in close proximity, data having possibility of causing deterioration in quality of the MR image can be excluded during data acquisition of the MR signals by receiving the timing signal indicative of the application timing of the external RF pulse. Thereby, the MRI apparatus 1 can acquire MR signals while maintaining satisfactory image quality. Thus, when a plurality of MRI apparatuses having the same or the similar static magnetic field strength are installed, their installation conditions such the minimum distance between these MRI apparatuses in terms of interference avoidance are relaxed. In addition, the configuration and effects of this embodiment can reduce the requirements for shield room equipment such as the radio-wave shield and the magnetic-field shield.

First Modification of First Embodiment

Figure 7:
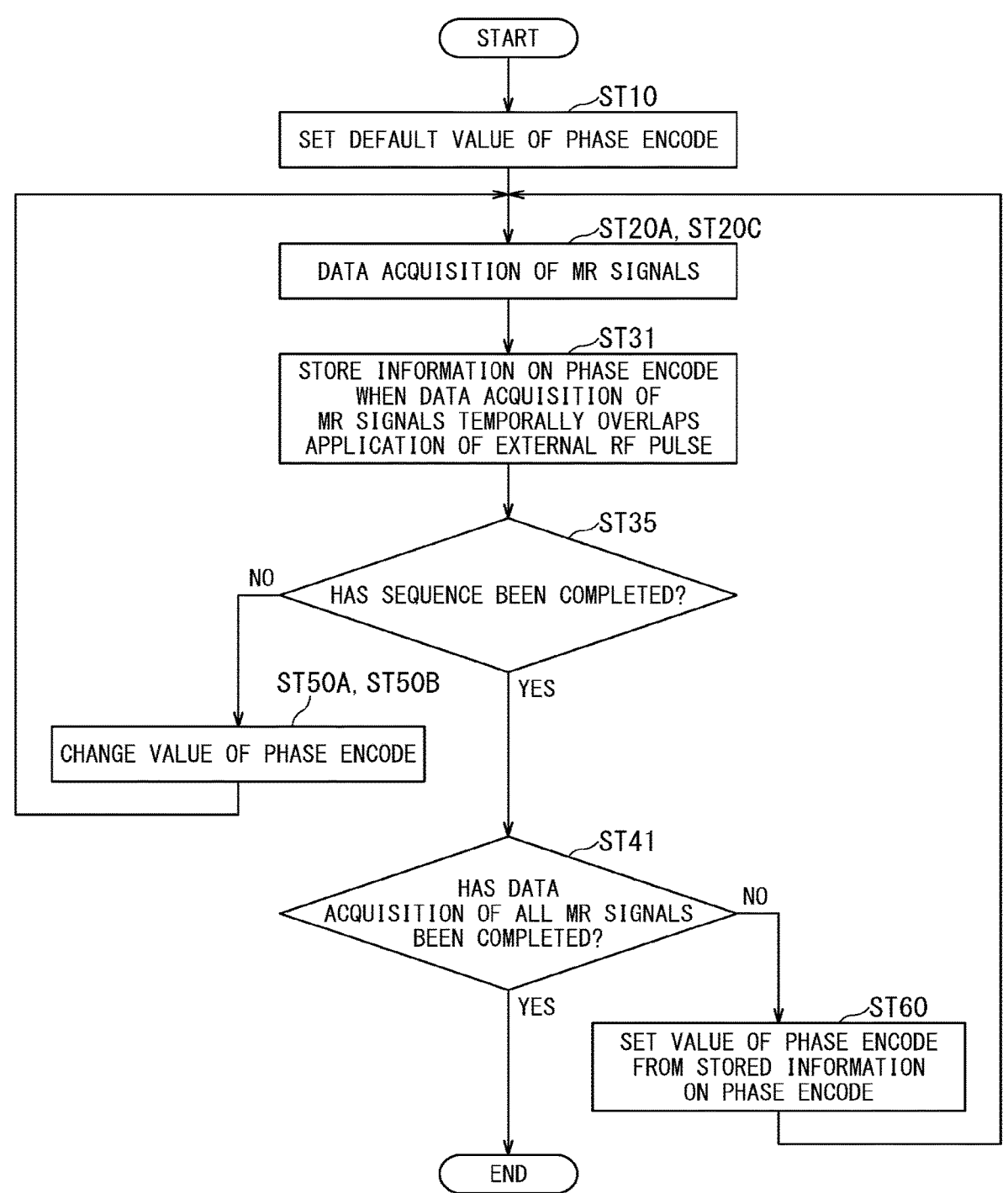
FIG. 7 is a flowchart illustrating operation of the data acquisition of MR signals according to the first modification of the first embodiment.

FIG. 7 is a flowchart illustrating operation of the data acquisition of MR signals according to the first modification of the first embodiment. As shown in FIG. 7, when it is determined that the external RF pulse has a possibility of affecting the MR signal during its acquisition, the MRI apparatus 1 stores the information on the phase encode of the MR signal that has been invalidated based on the determination. The MRI apparatus 1 then reacquires the MR signals having the same phase encodes as that of the invalidated MR signals after the sequence of a series of phase encoding is completed. This timing is what the first modification differs from the first embodiment in which an MR signal having the same phase encode as that of the invalidated MR signal is acquired again immediately after invalidating the MR signal each time, and the first modification is substantially the same as the first embodiment in terms of hardware structure.

For distinction in the following description, the data acquisition step in FIG. 7 is denoted by the step ST20A when the data acquisition of MR signals is performed by the acquisition function 341, and is denoted by the step ST20C when the data acquisition of MR signals is performed by the reacquisition function 343. Similarly, the step of changing the phase encode in FIG. 7 is denoted by the step ST50A when the phase encode is changed by the acquisition function 341, and is denoted by the step ST50B when the phase encode is changed by the reacquisition function 343.

In FIG. 7, the steps ST10 and ST20A, which are not substantially different from the first embodiment, are denoted by the same reference signs, and duplicate descriptions are omitted. After the step ST20A, the processing proceeds to the step ST31.

In the step ST31, for each unit of the repetition time, the determination function 342 performs determination as to whether the external RF pulse has a possibility of affecting the MR signal during acquisition or not. If it is determined that the external RF pulse has a possibility of affecting the MR signal during acquisition, the memory 350 stores the information on the phase encode of the invalidated MR signal based on the determination. After the step ST31, regardless of the result of the determination as to whether the external RF pulse has a possibility of affecting the MR signal during acquisition or not, the processing proceeds to the step ST35.

In the step ST35, the acquisition function 341 and the reacquisition function 343 determine whether the sequence is completed or not. The "completion of the sequence" means that execution of the sequence of a "group of phase encodes" as planned has completed, regardless of whether the external RF pulse is determined to have a possibility of affecting the MR signals during acquisition or not. The "group of phase encodes" means all the phase encodes required for reconstructing one MR image. The "group of phase encodes" means the phase encodes in one group when the phase encodes are divided into a plurality of groups.

If the determination as to whether the sequence is completed or not is performed by determining whether data acquisition of all phase encodes are completed or not, after the data acquisition of MR signals of all the phase encodes, data of MR signals are reacquired using the same phase encodes as the respective invalidated MR signals, for example, stored in the memory 41.

In the case where all the phase encodes are divided into a plurality of groups and determination as to whether acquisition of the MR signals of all the phase encodes is completed or not is made for each group, data of MR signals having the same phase encodes as the respective invalidated MR signals in a specific group are reacquired after acquisition of the MR signals in this specific group. The above-described processing is repeated in each group so as to acquire data of the MR signals of all the phase encodes in all groups.

In the step ST35, if it is determined that the sequence has not yet completed (i.e., NO in FIG. 7), the processing proceeds to the step ST50A. The step ST50A is not substantially different from the step ST50A in FIG. 4, and duplicate descriptions are omitted.

In the step ST35, if it is determined that the sequence has completed (i.e., YES in FIG. 7), the processing proceeds to the step ST41.

In the step ST41, if it is determined that data acquisition of all the MR signals has not yet been completed (i.e., NO in FIG. 7), the processing proceeds to the step ST60. In the step ST41, if it is determined that data acquisition of all the MR signals has been completed (i.e., YES in FIG. 7), the routine in FIG. 7 is completed. After the data acquisition of all the MR signals is completed, the MR image is reconstructed.

In the step ST60, the reacquisition function 343 acquires information on the phase encode of the stored invalidated MR signal, and sets this the phase encode as a new phase encode. After the step ST60, the processing proceeds to the step ST20C.

In the step ST20C, the reacquisition function 343 acquires data of the MR signals in units of repetition time in the phase encode having been set. After completion of the sequence, the reacquisition function 343 reacquires MR signals having the same phase encodes as the respective invalidated MR signals. In addition, regardless of the result of the determination as to whether the external RF pulse has a possibility of affecting the MR signal during acquisition or not, the reacquisition function 343 keeps both the repetition time and the application cycle of the RF pulse for generating the MR signals constant to reacquire the MR signals.

The processing subsequent to setting the respective phase encodes of the invalidated MR signals as the new phase encode is not substantially different from the above-described processing except that if it is determined in the step ST35 that the sequence has not yet been completed (i.e., NO in FIG. 7), the processing then proceeds to the step ST50B. Thus, duplicate descriptions are omitted.

In the step ST50B, the reacquisition function 343 changes the phase encode. After changing the phase encode, the processing proceeds to the step ST20C in which MR signals are sequentially acquired in units of repetition time. For example, change of the phase encode is performed based on table data and/or information on the phase encode stored in the memory 350.

Second Modification of First Embodiment

Figure 8:
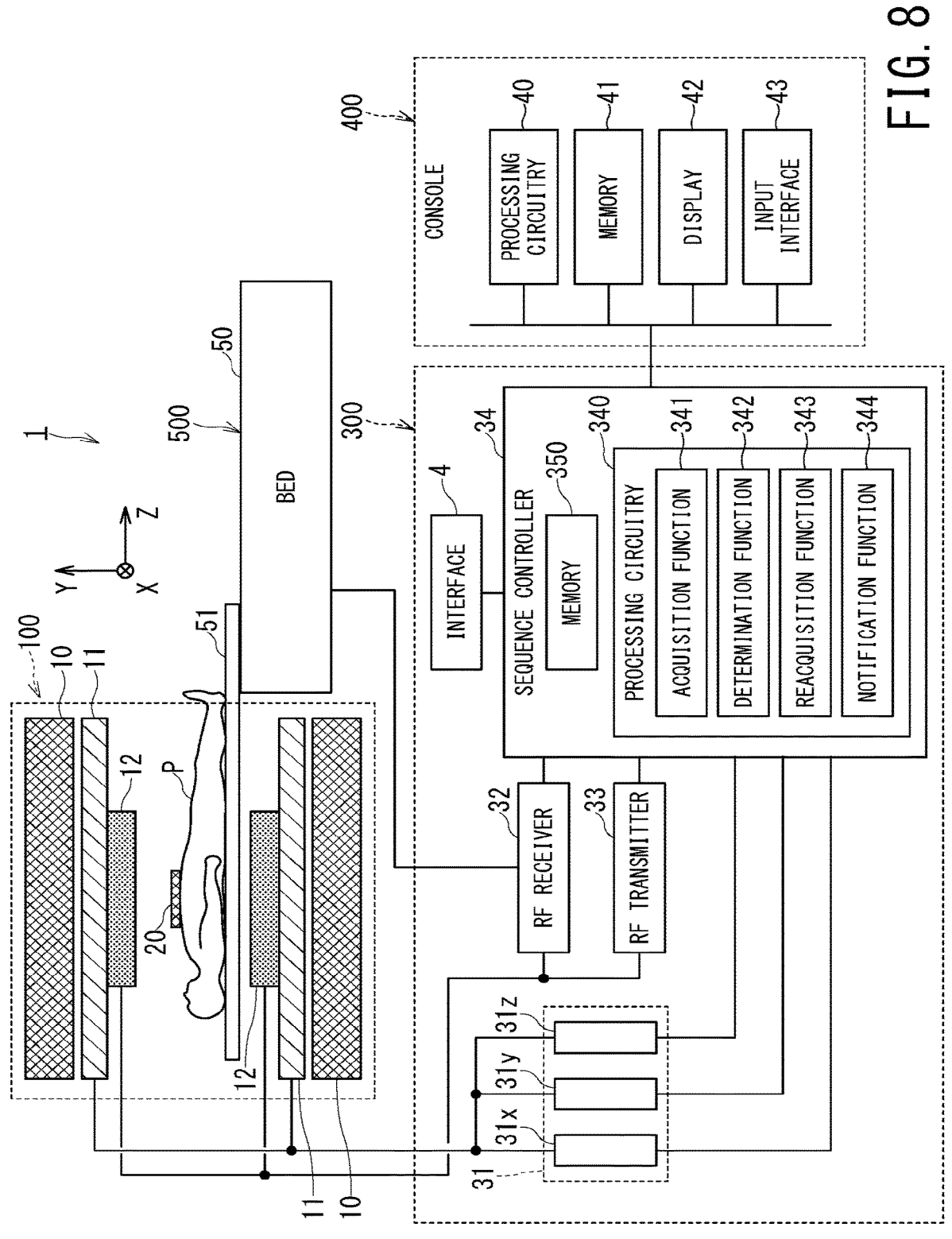
FIG. 8 is a block diagram illustrating an overall configuration of the MRI apparatus according to the second modification of the first embodiment.

FIG. 8 is a block diagram illustrating an overall configuration of the MRI apparatus 1 according to the second modification of the first embodiment. As shown in FIG. 8, the MRI apparatus 1 according to the second modification of the first embodiment differs from the first embodiment in that the processing circuitry 340 further implements a notification function 344. Since other configurations of the second modification are not substantially different from the first embodiment shown in FIG. 1, the same components are denoted by the same reference signs and duplicate descriptions are omitted.

When a time scanning an object is extended because of the factors such as the external RF pulse being determined to have a possibility of affecting the MR signal during acquisition and data of MR signals to be invalidated continuing to some extent, the notification function 344 informs the user of information indicating that the time of scanning the object will be extended. The time extension of scanning the object may be informed by using the display 42 and voice.

In addition, in the case where the external RF pulse is determined to have a possibility of affecting the MR signal during acquisition, the notification function 344 may inform the user of the newly calculated extended scan time based on the number of the invalidated MR signals and the imaging conditions such as TR, by using a notification means such as the display 42 and voice.

According to the MRI apparatus 1 of the second modification of the first embodiment, the user can be informed of the extension of the scan time. Then the user can take action to reduce the burden on the examinee, such as informing the examinee of the extension, depending on how long the time will be extended.

Third Modification of First Embodiment

Figure 9:
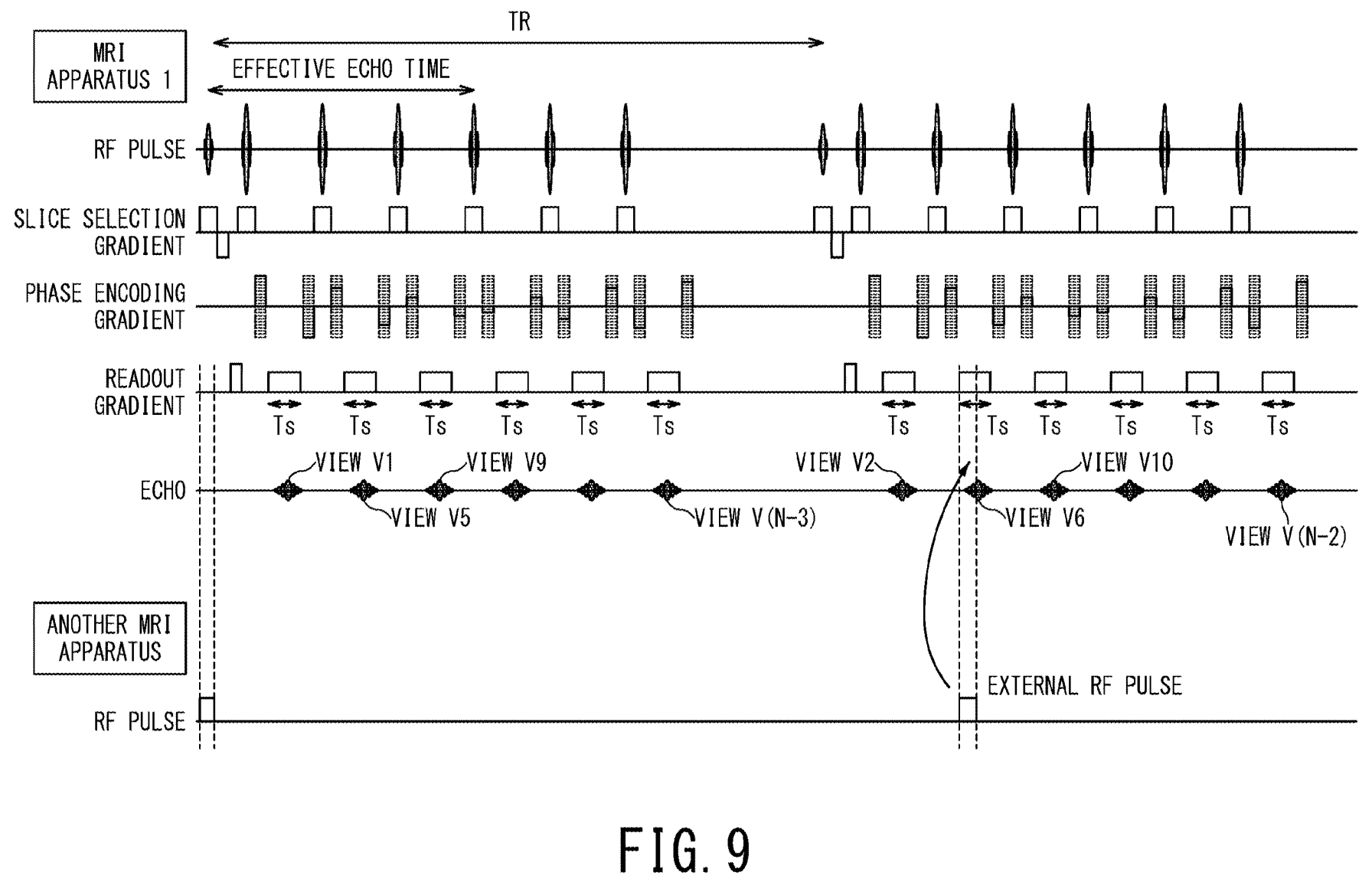
Figure 10:
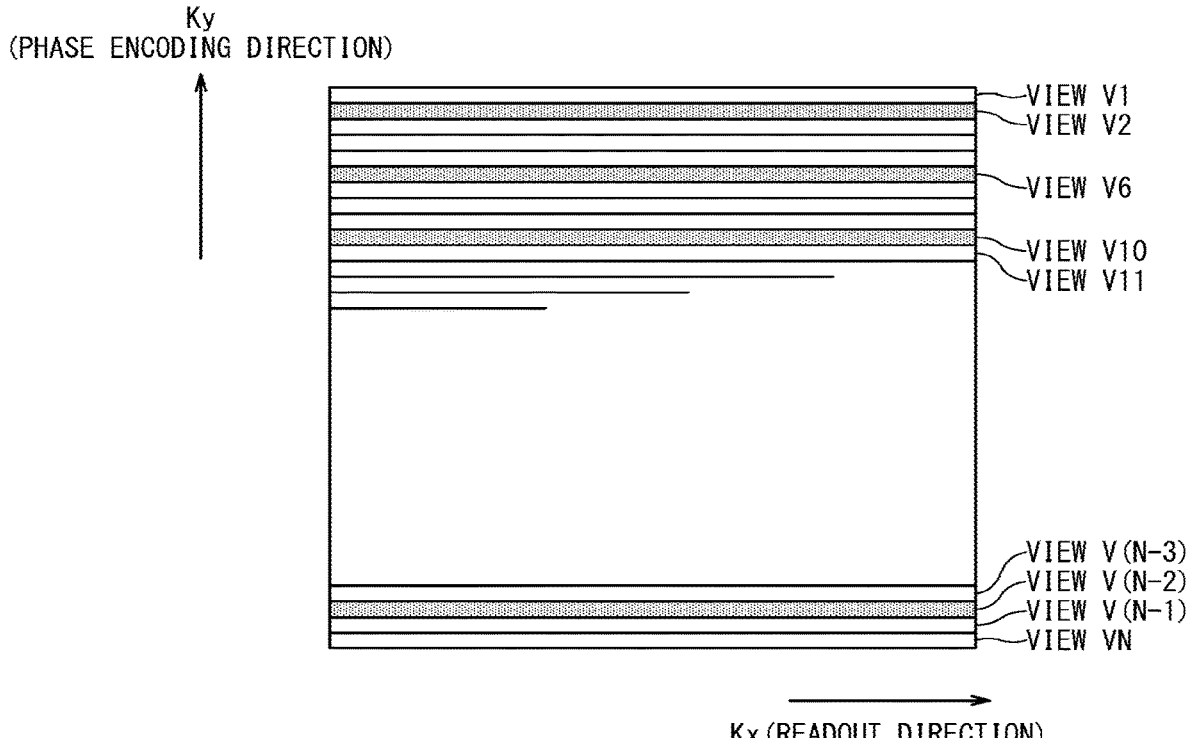
FIG. 10 is a schematic k-space data filling diagram illustrating an acquisition order of MR signals according to the third modification of the first embodiment.

Different from the first embodiment where the data acquisition of the MR signal from one view is performed per one TR, the MRI apparatus 1 according to the third modification of the first embodiment performs the data acquisition of the MR signals from a plurality of views per one TR. A description will be given of the case where the MR signals are affected by the external RF pulse during data acquisition in the two-dimensional fast spin echo (FSE) method by referring to FIG. 9 and FIG. 10. Note that TE indicates the effective TE. FIG. 9 and FIG. 10 illustrate a case where: the total number of views required for generating one image is defined as N which is a natural number, the total views are divided into four segments, and MR signals in each view within one segment are acquired in one TR. In other words, FIG. 9 and FIG. 10 illustrate a case where the number of echoes per one TR is N/4. The number of echoes per one TR can be set according to the imaging conditions.

In FIG. 9, for example, the phase encode is changed in such a manner that a total of N/4 MR signals are acquired with view intervals of 4 in the first TR, i.e., the respective MR signals in the view V1, the view V5, the view V9, . . . and the view V (N–3) are acquired in the first TR. Similarly, in the second TR, the phase encode is changed in such a manner that the respective MR signals in the view V2, the view V6, the view V10, . . . and the view V (N–2) are acquired. While changing the phase encodes in this manner, the MRI apparatus 1 acquires the data of MR signals from the view V1 to the view VN.

For example, if the timing signal indicative of the application timing of the external RF pulse is received during data acquisition of the MR signal in the view V6 in the second TR, the data of the MR signal in the view V6 is invalidated. In this case, in the third TR immediately after the invalidation, at least the MR signal having the same phase encode as that of the invalidated MR signal in the view V6 is reacquired. As shown by the hatched region in FIG. 10, the MR signals to be reacquired in the third TR may include not only the invalidated view V6 but also the view V2, view V10, . . . , and the view V(N–2) where data acquisition is performed in the second TR, for example.

In other words, the acquisition function 341 may sequentially acquire the plurality of MR signals in units of repetition time while changing the plurality of phase encodes at predetermined repetition time. For each unit of repetition time, the determination function 342 may determine whether the external RF pulse has a possibility of affecting at least one MR signal among the plurality of MR signals during acquisition or not. If the external RF pulse is determined to have the possibility of affecting at least one MR signal among the plurality of MR signals during acquisition, the determination function 342 may reacquire the MR signals having the same phase encodes as the respective invalidated MR signals.

Other Modification of First Embodiment

In addition to the two-dimensional SE method and the two-dimensional FSE method, the MRI apparatus 1 can use known other 2D or 3D pulse sequences such as the IR method, the SSFP method, the GRE method, and the EPI method.

When MR signal is acquired in three dimensions, slice phase encoding using the slice selection gradient pulse Gs is also included as phase encoding. In this case, the MRI apparatus 1 sequentially acquires MR signals in units of repetition time while changing the slice phase encode at a predetermined repetition time and determines whether the external RF pulse has a possibility of affecting the MR signals during acquisition in each unit of repetition time. The MR signals having the same slice phase encodes as the respective invalidated MR signals may be reacquired immediately after the invalidation or after the completion of data acquisition of a group of slice phase encodes. When data of MR signals of all the slices in the same view are firstly acquired followed by data acquisition of MR signals of all the slices in the next view, a group of slice phase encodes may be set as all the slice phase encodes for one phase encode of the phase encoding gradient pulse Gp, for example.

Figure 6:
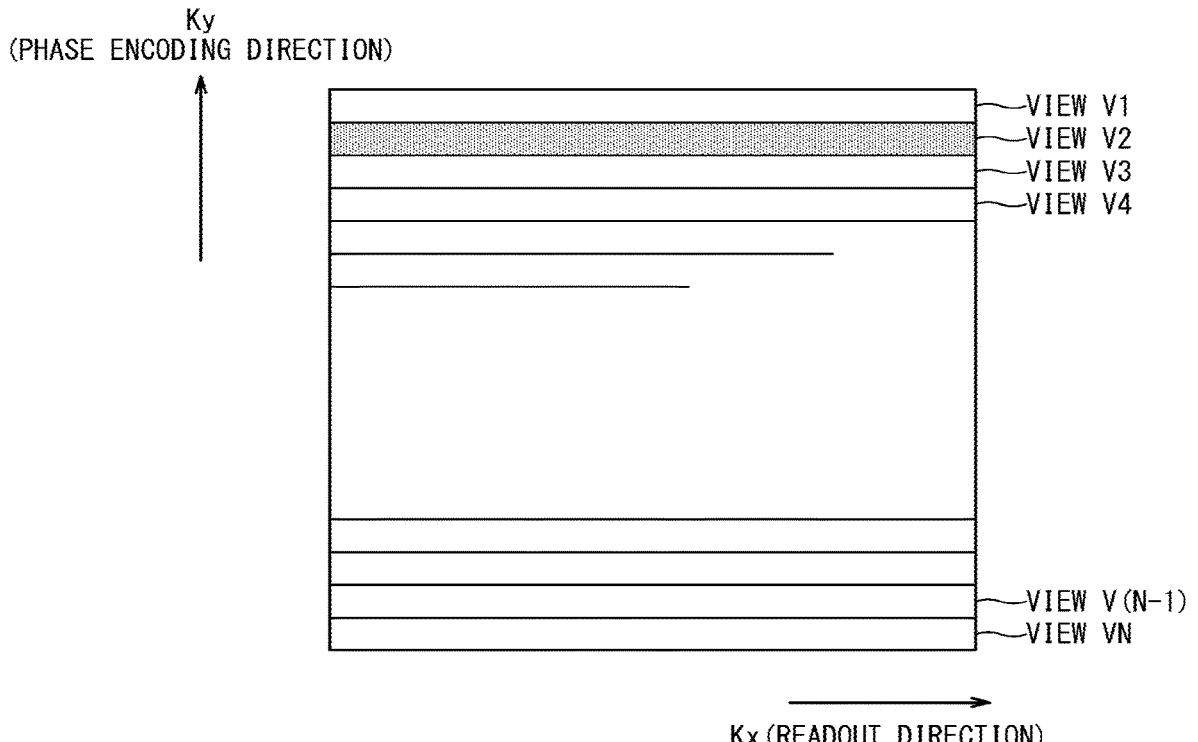
FIG. 6 is a schematic k-space data filling diagram illustrating an acquisition order of MR signals according to the first embodiment.

FIG. 6 and FIG. 10 show a Cartesian method in which data of MR signals with different phase encodes are acquired by changing the phase encoding gradient pulse Gp with a small increment/decrement and k-space is filled with these MR signals arranged in parallel in the readout direction. However, the method for acquiring the k-space data may be a known non-Cartesian acquisition method such as a radial acquisition method in which data of the plurality of MR signals with different rotation angles are arranged radially around the origin of k-space. For example, in the case of acquiring MR signals by using the radial acquisition method, phase encoding based on the phase gradient encoding pulse Gp and the readout gradient pulse Gr may be performed. In other words, if it is determined that the external RF pulse has a possibility of affecting the MR signal during acquisition when using the radial acquisition method, this MR signal may be invalidated and an MR signal having the same phase encode as this invalidated MR signal can be reacquired.

Second Embodiment

Figure 11:
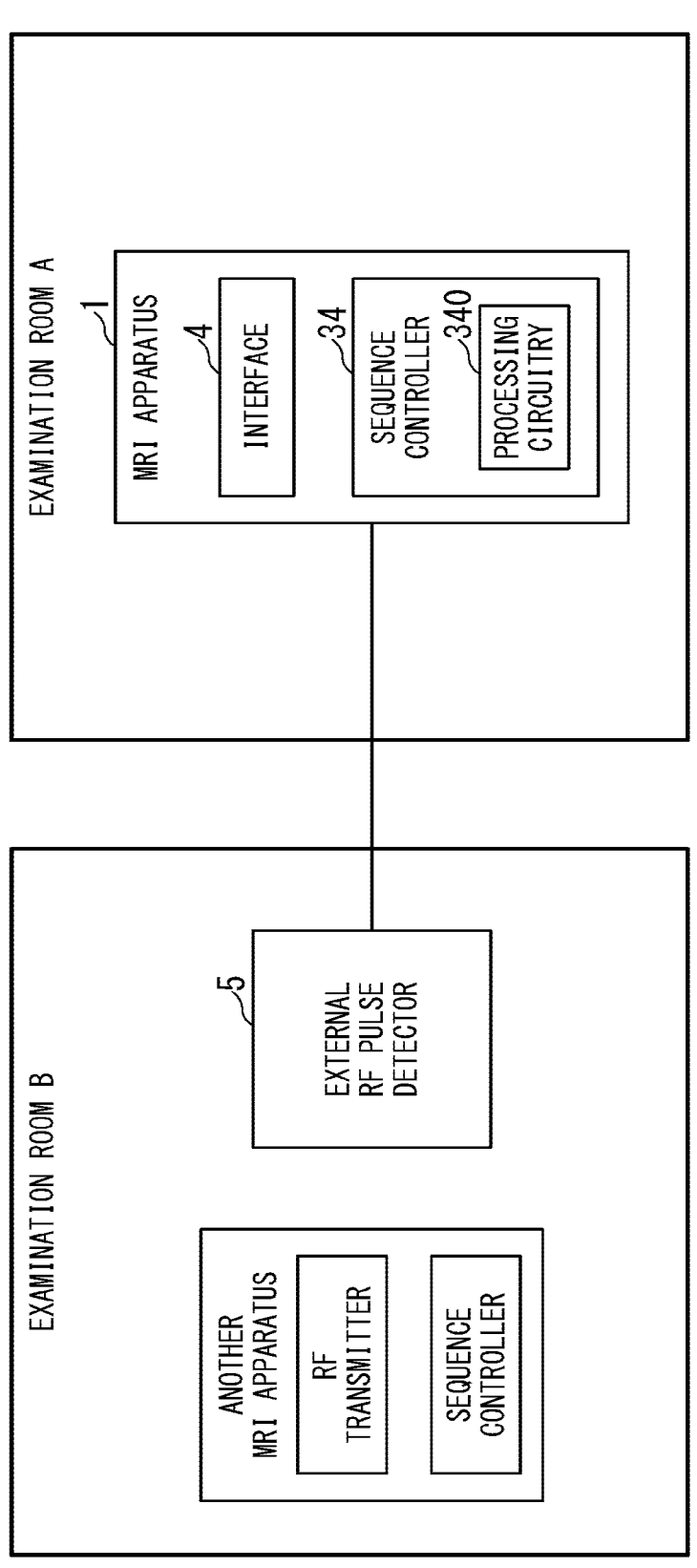
FIG. 11 is a schematic diagram illustrating relationship between the MRI apparatus according to the second embodiment and another MRI apparatus.

FIG. 11 is a schematic diagram illustrating relationship between the MRI apparatus 1 according to the second embodiment and another MRI apparatus. As shown in FIG. 11, the MRI apparatus 1 according to the second embodiment differs from the first embodiment in terms of receiving the timing signal indicative of the application timing of the external RF pulse from an external-RF-pulse detector 5 provided in the examination room B of the other MRI apparatus. In addition, the interface 4 of the MRI apparatus 1 according to the second embodiment is configured to be able to receive information on the external RF pulse from the external-RF-pulse detector 5. The components that are not substantially different from the first embodiment shown in FIG. 1 are denoted by the same reference signs, and duplicate descriptions are omitted.

The MRI apparatus 1 further includes the external-RF-pulse detector 5 in the examination room B where the other MRI apparatus is installed. The external-RF-pulse detector 5 is configured to be able to detect the timing signal indicative of the application timing of the external RF pulse in the other MRI apparatus. The external-RF-pulse detector 5 sends the timing signal indicative of application timing of the external RF pulse to the interface 4. The interface 4 can receive the timing signal indicative of the application timing of the external RF pulse from the external-RF-pulse detector 5. Since the operation of the MRI apparatus 1 according to the second embodiment is not substantially different from the first embodiment shown in FIG. 4 except that the second embodiment uses the timing signal indicative of the application timing of the external RF pulse received from the external-RF-pulse detector 5, duplicate descriptions are omitted.

According to the MRI apparatus 1 of the second embodiment, even if the MRI apparatus 1 and another MRI apparatus cannot communicate as being products from different manufacturers, for example, the MRI apparatus 1 can receive the timing signal indicative of the application timing of the external RF pulse, and thus can exclude data having a possibility of causing deterioration in quality of MR images during data acquisition of MR signals.

Third Embodiment

Figure 12:
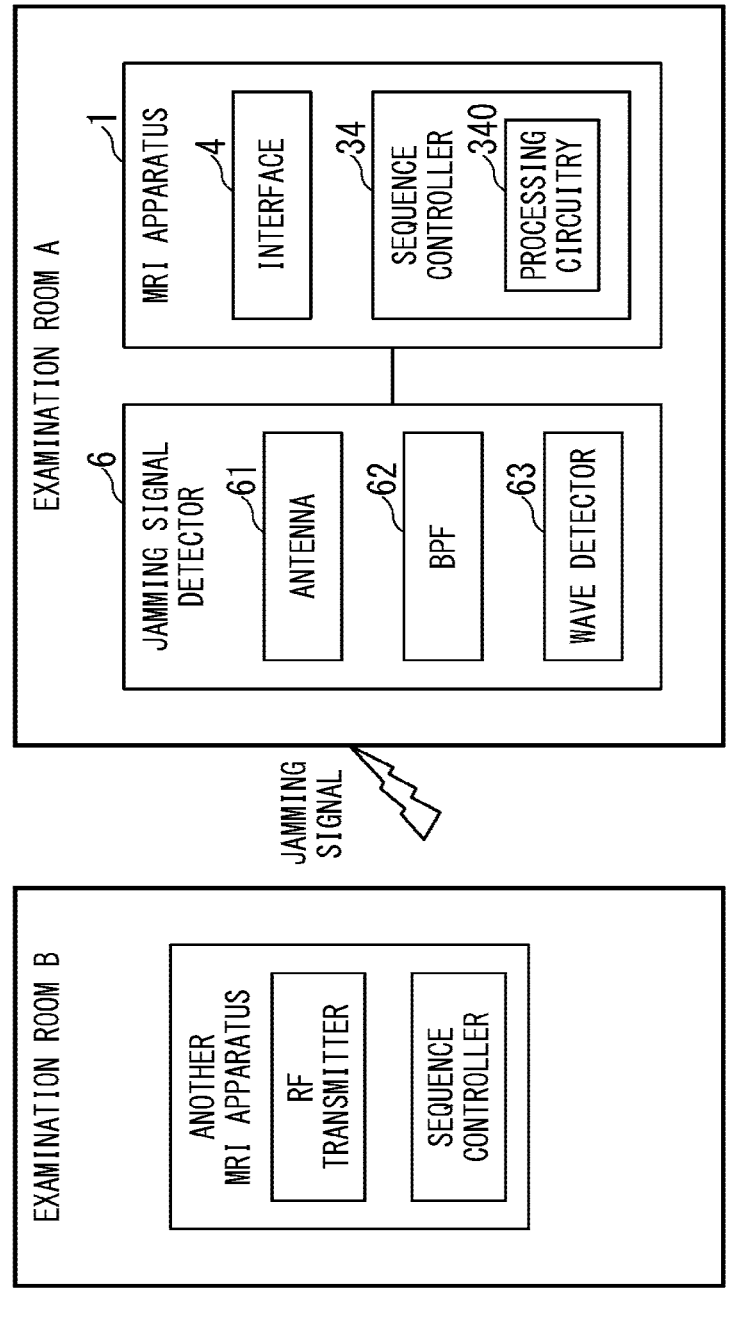
FIG. 12 is a schematic diagram illustrating relationship between the MRI apparatus according to the third embodiment and another MRI apparatus.

FIG. 12 is a schematic diagram illustrating a diagram illustrating a part of configuration of an MRI apparatus according to the third embodiment. As shown in FIG. 12, the MRI apparatus 1 according to the third embodiment differs from the first embodiment in that the configuration of the third embodiment further includes a jamming signal detector 6 configured to detect jamming signals including the external RF pulse. Further, the interface 4 of the MRI apparatus 1 according to the third embodiment is configured to be able to receive information from the jamming signal detector 6. The components that are not substantially different from the first embodiment shown in FIG. 1 are denoted by the same reference signs, and duplicate descriptions are omitted.

FIG. 12 also illustrates the relationship between the MRI apparatus 1 according to the third embodiment and the other MRI apparatus. As shown in FIG. 12, the jamming signal detector 6 is installed in the examination room A where the MRI apparatus 1 is installed.

The jamming signal detector 6 includes an antenna 61, a bandpass filter (BPF) 62, and a wave detector 63, for example. The antenna 61 receives the jamming signals. The jamming signals include noise occurred during data acquisition of MR signals by the MRI apparatus 1, the external RF pulse of the other MRI apparatus, and noise ascribable to the external RF pulse, for example. Of the jamming signals received by the antenna 61, only the jamming signal in the magnetic resonance frequency band corresponding to the static magnetic field strength of the MRI apparatus 1 passes the bandpass filter 62. The wave detector 63 detects the jamming signal that is in the above-described frequency band and has passed through the bandpass filter 62. The jamming signal detector 6 sends information on the detected jamming signal to the interface 4 of the MRI apparatus 1.

In addition, the jamming signal detector 6 is installed outside the MRI apparatus 1 in the examination room A. Of the components of the jamming signal detector 6, at least the antenna 61 may be installed in the examination room A but close to the examination room B where the other MRI apparatus is installed, for example. If the antenna 61 is installed in the examination room A at a position close to the examination room B, the antenna 61 can efficiently receive the jamming signal caused by the other MRI apparatus.

Figure 13:
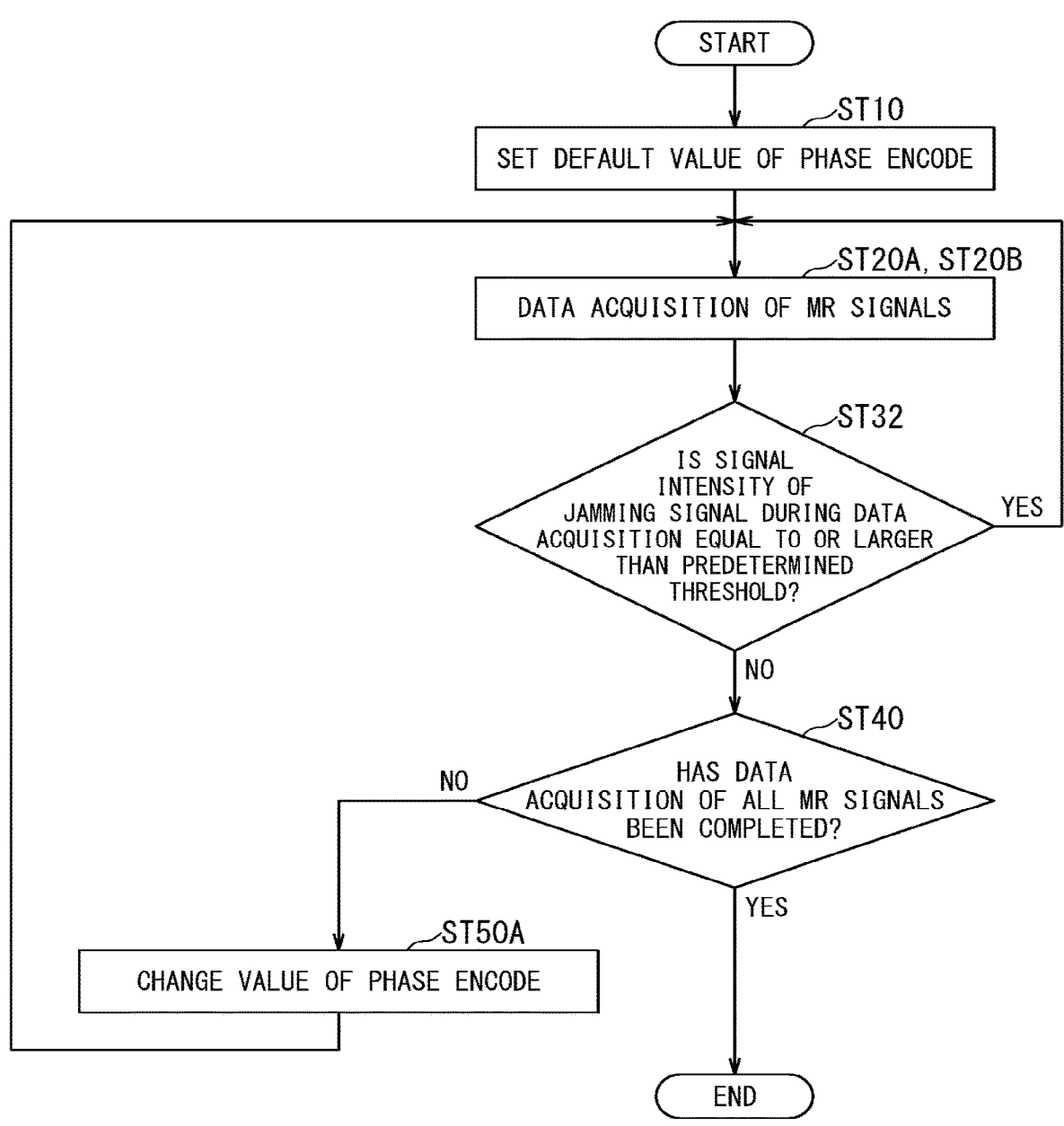
FIG. 13 is a flowchart illustrating operation of the data acquisition of MR signals according to the third embodiment.

FIG. 13 is a flowchart illustrating operation of the data acquisition of the MR signals according to the third embodiment. In the first embodiment shown in the above-described FIG. 4, it is determined whether the external RF pulse has a possibility of affecting the MR signals during acquisition or not, based on whether or not the data acquisition of the MR signals temporally overlaps the application time of the external RF pulse indicated by the timing signal sent from the other MRI apparatus. The third embodiment differs from the first embodiment in that whether the jamming signal including the external RF pulse has a possibility of affecting MR signals during acquisition or not is determined based on information on the jamming signal detected during the data acquisition of the MR signals.

In FIG. 13, the steps ST10, ST20A, ST20B, ST40, and ST50A which are not substantially different from the first embodiment shown in FIG. 4 are denoted by the same reference signs, and duplicate descriptions are omitted. In the steps ST20A, ST20B, and ST50A, regardless of the result of the determination as to whether the jamming signal including the external RF pulse has a possibility of affecting MR signals during acquisition or not, the acquisition function 341 and the reacquisition function 343 keep both the repetition time and the application cycle of the RF pulse for generating the MR signals constant to acquire the MR signals.

In the step ST32, the determination function 342 determines whether the jamming signal has a possibility of affecting the MR signal during acquisition or not, based on information on the jamming signal received by the interface 4, for each unit of repetition time. The determination function 342 acquires information about the period when another MRI apparatus outputs the external RF pulse, based on a detecting result of the jamming signal detector 6. For example, if a jamming signal larger in signal intensity than a predetermined threshold is detected by the jamming signal detector 6 during acquisition of the MR signal, the determination function 342 determines that the jamming signal has a possibility of affecting the MR signal during acquisition.

Figure 14:
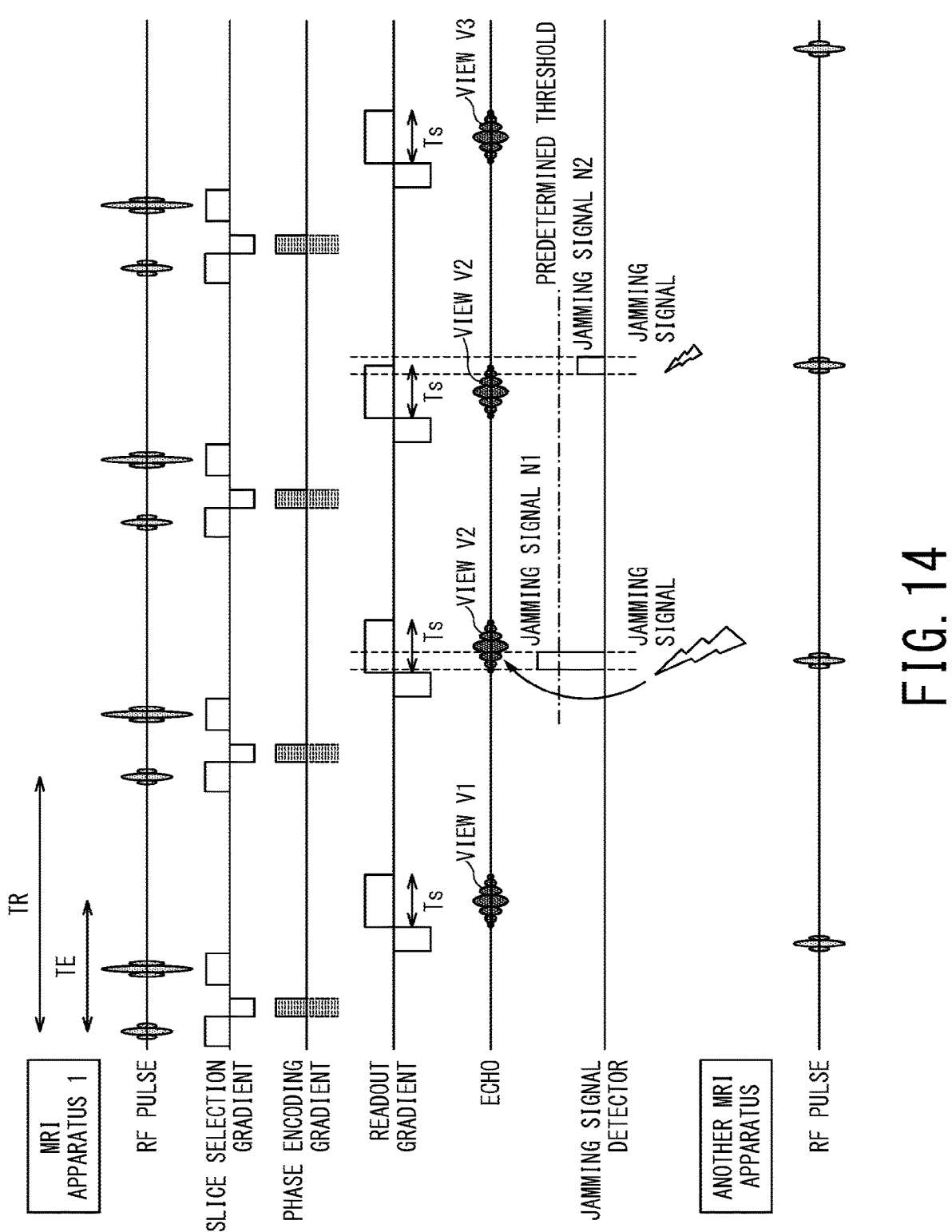
FIG. 14 is a timing chart illustrating the influence of jamming signals on the data acquisition of MR signals according to the third embodiment.

The step ST32 will be described in more detail by referring to FIG. 14. As shown in FIG. 14, the MRI apparatus 1 changes the phase encode up to the view VN (N: natural number) such that data of MR signals in the respective views including the view V1, the view V2, the view V3, view V4, . . . and the view VN can be acquired in the steady state in a manner similar to the case of FIG. 5, for example. In the case where a jamming signal N1 equal to or higher in signal intensity than the predetermined threshold is detected during data acquisition of the MR signal from the view V2, the data of the MR signal from the view V2 is invalidated, for example. In this case, an MR signal having the same phase encode as the invalidated MR signal of the view V2 is acquired again immediately after the invalidation. In the case of FIG. 14, though another jamming signal N2 is detected during reacquisition of the MR signal from the view V2, this jamming signal N2 is lower in signal intensity than the predetermined threshold, thus, the reacquired data is deemed valid, and data of the MR signal in the next view is subsequently acquired.

The predetermined threshold may be set based on the signal intensity of the acquired MR signals and the signal intensity of the jamming signal caused by the external RF pulse of the other MRI apparatus. Since the signal intensity of the acquired MR signal is different from the signal intensity of the jamming signal caused by the external RF pulse of another MRI apparatus, the threshold can be set so as to exclude jamming signals having higher signal intensity than the acquired MR signal, for example. Further, the predetermined threshold may be set by value stored in advance in the memory 350 in consideration of the efficiency of the antenna 61 and the wave detector 63.

In addition, the predetermined threshold is preferably set according to the signal intensity of the MR signals so that data of the MR signals are not invalidated unnecessarily or erroneously. For example, under conditions where the signal intensity of MR signals is high, the predetermined threshold is set to be higher than the conditions where the signal intensity of MR signals is low.

As shown in Expression 1 and Expression 2, the signal intensity of the MR signals to be acquired varies depending on the imaging conditions including the type of pulse sequence and various parameters, for example. The predetermined threshold may be set based on the imaging conditions including the type of pulse sequence to be executed by the MRI apparatus 1 and various parameters. In addition, the signal intensity of MR signals to be acquired varies depending on the output intensity of the RF pulse to be applied to the object P and the type of RF coil for receiving the MR signals. Hence, the predetermined threshold may be set based on the output intensity of the RF pulse to be applied to the object P in the MRI apparatus 1 and information on the RF coil for receiving the MR signals.

According to the MRI apparatus 1 of the third embodiment, when the external RF pulse from another MRI apparatus is mixed into data of the MRI apparatus 1 as a jamming signal during data acquisition of MR signals, the data can be invalidated and excluded. Also, when an external electromagnetic wave having a possibility of causing deterioration in image quality of MR images is accidentally generated by another MRI apparatus and is mixed into the data of the MRI apparatus 1 as a jamming signal, the data can be invalidated and excluded.

According to the imaging processing apparatus and imaging processing method related to MRI apparatus described in at least one above embodiment, even in the case where an MRI apparatus is installed near another MRI apparatus, MR signals can be acquired while image quality is being satisfactorily maintained.

In the above-described embodiments, the term "processor" means a circuit such as a special-purpose or general-purpose CPU, a GPU (Graphics Processing Unit), an ASIC, a programmable logic device including an SPLD (Simple Programmable Logic Device) and a CPLD (Complex Programmable Logic Device), and an FPGA, for example. When the processor is a CPU, for example, the processor implements various functions by reading in and executing the programs stored in the memory.

Furthermore, when the processor is an ASIC, for example, instead of storing the programs in the memory, the respective functions corresponding to the programs are directly incorporated as a logic circuit into the circuit of the processor. In this case, the processor implements various functions through hardware processing in which the programs incorporated into the circuit are read out and executed. Additionally or alternatively, the processor can also achieve various functions by combining software processing and hardware processing.

Although a description has been given of the case where a single processor of the processing circuitry achieves the respective functions in the above-described embodiments, the processing circuitry may be configured by combining a plurality of independent processors in such a manner that each processor implements each function. Further, when a plurality of processors are provided, a memory for storing the programs may be individually provided for each processor or a single memory may collectively store the programs corresponding to the functions of all the processors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the scope of the inventions as defined by the appended claims.

What is claimed is:

1. An image processing apparatus, comprising:
processing circuitry configured to:
control a first MRI apparatus to output a first RF pulse to an object to acquire MR data corresponding to an MR signal detected b a receiving coil, the MR signal being emitted from the object by the first RF pulse output from the first MRI apparatus;
acquire information indicating a period in which a second MRI apparatus outputs a second RF pulse, the second MRI apparatus being installed in a position where the second RF pulse affects the MR signal to be detected by the receiving coil;
control the first MRI apparatus to output the first RF pulse to the object to acquire the MR data corresponding to the MR signal regardless of whether the second MRI apparatus outputs the second RF pulse;
control, in a case where a first MR signal as the MR signal has been detected by the receiving coil in the period, the first MRI apparatus to output the first RF pulse to the object to acquire the MR data corresponding to a second MR signal as the MR signal corresponding to a phase encode of the first MR signal after the first MR signal has been detected by the receiving coil; and
generate an image based on the MR data corresponding to the MR signal including the second MR signal.

2. The image processing apparatus according to claim 1, wherein the processing circuitry is further configured to inform a user of information indicating a time to be extended by controlling the first MRI apparatus to output the first RF pulse to the object to acquire the second MR signal after acquiring the first MR signal.

3. The image processing apparatus according to claim 1, wherein the phase encode includes a slice phase encode when the MR signal is acquired in three dimensions.

4. The image processing apparatus according to claim 1, wherein the first MR signal is not used for generating the image.

5. The image processing apparatus according to claim 1, further comprising a memory configured to store information corresponding to the phase encode of the first MR signal for acquiring the MR data corresponding to the second MR signal to the phase encode of the first MR signal.

6. The image processing apparatus according to claim 1, wherein the first RF pulse is repeatedly output at an interval of repetition time (TR) to keep each of the MR signals in a steady state from the first MRI apparatus.

7. An image processing method, comprising:

controlling a first MRI apparatus to output a first RF pulse to an object to acquire MR data corresponding to an MR signal detected by a receiving coil, the MR signal being emitted from the object by the first RF pulse output from the first MRI apparatus;

acquiring information indicating a period in which a second MRI apparatus outputs a second RF pulse, the second MRI apparatus being installed in a position where the second RF pulse affects the MR signal to be detected by the receiving coil;

controlling the first MRI apparatus to output the first RF pulse to the object to acquire the MR data corresponding to the MR signal regardless of whether the second MRI apparatus outputs the second RF pulse;

controlling, in a case where a first MR signal as the MR signal has been detected by the receiving coil in the period, the first MRI apparatus to output the first RF pulse to the object to acquire the MR data corresponding to a second MR signal as the MR signal corresponding to a phase encode of the first MR signal after the first MR signal has been detected by the receiving coil; and generating an image based on the acquired MR data corresponding to the MR signal including the second MR signal.

* * * * *